United States Patent [19]

Hynecek

[11] Patent Number: 4,995,061
[45] Date of Patent: Feb. 19, 1991

[54] TWO-PHASE CCD IMAGER CELL FOR TV INTERLACE OPERATION

[75] Inventor: Jaroslav Hynecek, Richardson, Tex.

[73] Assignee: Texas Instruments Incorporated, Dallas, Tex.

[21] Appl. No.: 134,283

[22] Filed: Dec. 17, 1987

[51] Int. Cl.$^5$ .................. G11C 19/28; H01L 29/78; H01L 27/14; H04N 3/14
[52] U.S. Cl. .......................... 377/58; 357/24; 357/30; 358/213.26; 358/213.19
[58] Field of Search ............. 357/24, 30; 377/57–63; 358/213.15, 213.26, 213.27, 213.19

[56] References Cited
U.S. PATENT DOCUMENTS

| 3,932,775 | 1/1976 | Kosonocky | 357/24 LR |
| 4,229,752 | 10/1980 | Hynecke | 357/24 M |
| 4,362,575 | 12/1982 | Wallace | 357/24 M |
| 4,513,313 | 4/1985 | Kinoshita et al. | 377/62 |
| 4,733,406 | 3/1988 | Kinoshita et al. | 377/61 |

Primary Examiner—Gene M. Munson
Attorney, Agent, or Firm—Mel Sharp; James T. Comfort; Peter B. Barndt

[57] ABSTRACT

A CCD imager cell (36, 38) is formed at a face of a semiconductor substrate (10) and has first (36) and second (38) phase regions. A first clocked well (14) is provided for receiving charge integrated in the first phase region (36). A second clocked well (16) is provided for receiving charge integrated in a second phase region (38) adjacent the first phase region (36). A first gate (20) is insulatively disposed over the first clocked well (14), and a second gate (22) is insulatively disposed over the second clocked well (16). A controller controls $\phi_1$ and $\phi_2$ pulses such that the charge is transferred from a selected one of the first and second clocked wells (14, 16) to the other, thus integrating all of the charge in the cell into one clocked well thereof. This unified charge is then transferred out from clocked well to clocked well.

18 Claims, 3 Drawing Sheets

TWO-PHASE CCD IMAGER CELL FOR TV INTERLACE OPERATION

TECHNICAL FIELD OF THE INVENTION

This invention relates in general to CCD imager arrays, and more particularly to CCD imager architectures suitable for interlace operation and having an antiblooming feature.

BACKGROUND OF THE INVENTION

Conventional virtual-phase CCD imager arrays comprise a plurality of virtual-phase cells, each having a virtual barrier, a virtual well, a clocked barrier and a clocked well all formed at a face of a semiconductor substrate. Conventionally, these arrays are operated in an integration step and a charge transfer step. During the integration step, charge is integrated in the virtual well of each of the cells. During the charge transfer step, a voltage bias on the device gates is increased from a low voltage to a high voltage in order to transfer the charge from the virtual well to an adjacent clocked well. This voltage bias is then removed in order to transfer the charge to a next adjacent virtual well. The charges are thus moved from well to well until the end of the array is reached, wherein the charges are transferred into cells of a serial register and then read out, one row of cells at a time.

Certain conventional CCD imager cells include an antiblooming drain, wherein an excess of charge built up during an integration step may be transferred through a drain barrier to a drain, thus preventing the transfer of the excess charge over to other virtual wells or "blooming". However, in conventional structures blooming level cannot be easily independently adjusted, and additional structures such as implanted barriers or gates must be added.

It has become desirable to construct a CCD imager array for television interlace operation. In an interlace mode, two fields of rows or lines of the CCD imager array cells are successively read. First, a field of odd lines is read, one after the other. Then, a field of even lines in between the odd lines is read, one after the other. A need thus exists for a CCD imager array adaptable to TV interlace operation that further includes a simple, independently adjustable antiblooming feature that can be incorporated without adding any additional mask steps in the fabrication process.

There are also a number of applications where it is necessary to generate a mirror image from a camera. In the past, this was accomplished by one of several methods, including reversing the electron beam scan in a TV pickup tube or reversing the electron beam scan in the display medium such as a CRT tube.

With the advent of solid stage image sensors, it is usually not possible to reverse the scan in the image sensor, since the scanning direction is preselected. This is particularly true in single- or two- phase structures where the directionality is built in by ion implantation. This presents a disadvantage in applications with mirror image sensing, since a new device is necessary to be designed for this case. A need has therefore arisen to provide an on-chip output register that can selectively read out a true image or a mirror image.

SUMMARY OF THE INVENTION

One aspect of the present invention comprises a CCD imager cell formed at a face of a semiconductor substrate and having first and second phase regions. The cell includes a first clocked well for receiving charge integrated in a first phase region, and a second clocked well for receiving charge integrated in a second phase region adjacent the first phase region. A first gate is insulatively disposed over the first clocked well, and a second gate is insulatively disposed over the second clocked well. A controller is provided for transferring the charge from a selected one of the first and second clocked wells to the other of the clocked wells by applying a predetermined voltage to a gate associated with that other of the clocked wells. The predetermined voltage (or low bias) is not, in the meanwhile, applied to the gate associated with the one of the clocked wells. In this manner, all of the charge that had been integrated in the cell resides in a single clocked well. Subsequently, a transferor is used for transferring the charge stored in this one clocked well to another well as a single signal.

One advantage of the invention is its use of virtual phase CCD technology, which in turn results in very low dark current.

In a preferred operation according to the invention, each clocked well has an associated virtual well. During a beginning portion of a transfer step of operation, both the first and second gates have a second (preferably high) bias voltage applied to them to transfer charge from adjacent virtual wells into the first and second clocked wells. Since one of the clocked wells will store the charge integrated in two virtual wells, it is preferred that the charge-storing capacity of each clocked well be at least equal to the charge storage capacity of two virtual wells.

According to another aspect of the invention, each clocked well region has associated therewith a clocked barrier region, and each virtual well region has associated therewith a virtual barrier region. Each cell comprises, in order, a virtual barrier region, a virtual well region, a clocked barrier region, and a clocked well region. A clock gate is insulatively disposed over the clocked well and barrier regions. A respective drain barrier region is formed adjacent each of the clocked well regions and is spaced from the virtual barrier regions. A drain region is formed in the semiconductor substrate adjacent the drain barrier region. The drain region is provided to receive excess charge from the respective virtual well region through the drain barrier region during the integration step of operation.

Charge transfer through the drain barrier region from the virtual well region does not occur during the transfer step of operation, as the charge is moved from one clocked well to another with no lasting residence of charge in any virtual well region. This provides a principal advantage of the invention in that antiblooming protection may be incorporated into the structure by proper sizing of the clocked well regions and not storing the charge in the virtual wells. The antiblooming control is effectively disabled during transfer between clocked wells, since the potential profile of the drain barrier regions is higher than those of the clocked wells in their high-biased states.

According to another aspect of the invention, the CCD imager array may be used in a TV interlace mode by selection of which clocked well in each cell will store the charge integrated in the cell. For the integration and transfer of an odd field of lines, a first clocked well in each of the cells has a high bias voltage applied to it, thereby causing the transfer of the charge in the cell to the first clocked well. The charge stored in these first clocked wells is then read out in "odd" lines of information. During a subsequent even substep of operation, the charge integrated into the cell is transferred into the second of the clocked wells whose potential profile has changed as a result of the application of a predetermined gate bias voltage.

This alternate selection of first and second clocked wells for storing the entire charge in the cell provides the additional advantage of increasing the resolution of the array during operation in a TV interlace mode. The resolution is achieved by an electronic pixel shift that recovers the resolution lost by charge summation of the two virtual wells or pixels of information in each cell.

According to a further aspect of the invention, a plug or a connector region is formed to extend from a virtual gate formed at the substrate face through a buried channel to the semiconductor substrate below, one connector or plug per virtual gate. This connection for the virtual gate is desirable because the virtual gate electrode is separated into discontinuous rectangles that are not electrically connected. The plug or connector has the additional advantage of improving charge transfer efficiency in those embodiments of the invention having long virtual barriers. Each virtual gate is coextensive in area with a virtual well and an adjoining virtual barrier. Preferably, the plug is formed in the virtual barrier as opposed to the virtual well in order not to decrease the area for the charge integration.

An additional advantage is provided by these connection plugs in that two-dimensional effects cause the virtual barrier potential between the plug and the buried channel boundary or "channel stop" to be higher than would exist without the plug. This small potential step causes an additional lateral field which helps to accelerate the electrons through the long virtual barrier regions.

In a further aspect of the invention, the CCD imager array further includes apparatus for outputting a mirror image of the image as stored in a memory array that is formed in the same semiconductor substrate. The memory array includes a plurality of storage elements arranged in rows and columns, each storage element operable to store an image signal. Columns are provided for transferring image signals from a row of elements to an edge of the array. A first CCD register is disposed adjacent the edge for receiving the image signals in parallel. A transfer gate is disposed adjacent the CCD register and opposite the edge. A second CCD register is disposed adjacent the transfer gate and opposite the first CCD register. The transfer gate is operable to transfer the image signals in parallel from the first register to the second register. A selected one of the first and second CCD registers is operable to serially output the image signals in a first direction when a true image is desired, or in a second direction when a mirror image is desired.

The on-chip output apparatus provides an advantage in that the device is operable to allow both directions of scanning, and can be switched from one to the other at will at the sensor end. This can be accomplished even during the image readout, so that halves of an image can be compared. The output register of the invention is particularly advantageous in positioning or aiming applications.

BRIEF DESCRIPTION OF THE DRAWINGS

Other aspects of the invention and their advantages will be comprehended with reference to the following detailed description in conjunction with the appended drawings, in which.

DETAILED DESCRIPTION

Figure 1A:
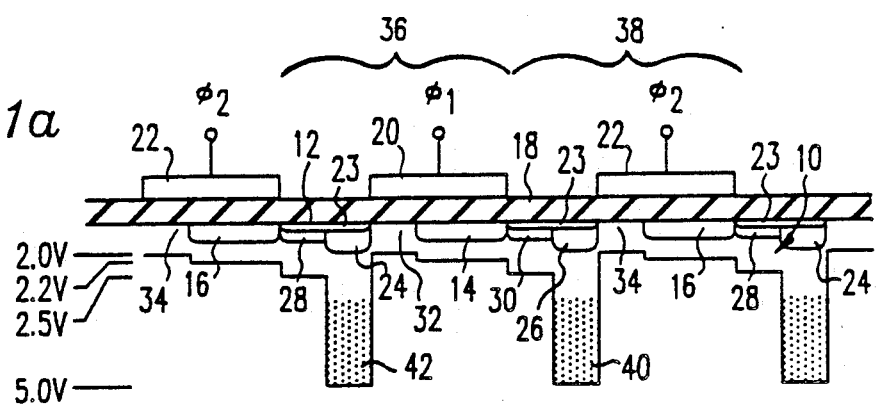
FIGS. 1a–1c are enlarged schematic sectional views of a portion of a virtual-phase CCD imager array according to the invention, showing successive stages of integration and transfer steps of operation.
Figure 1B:
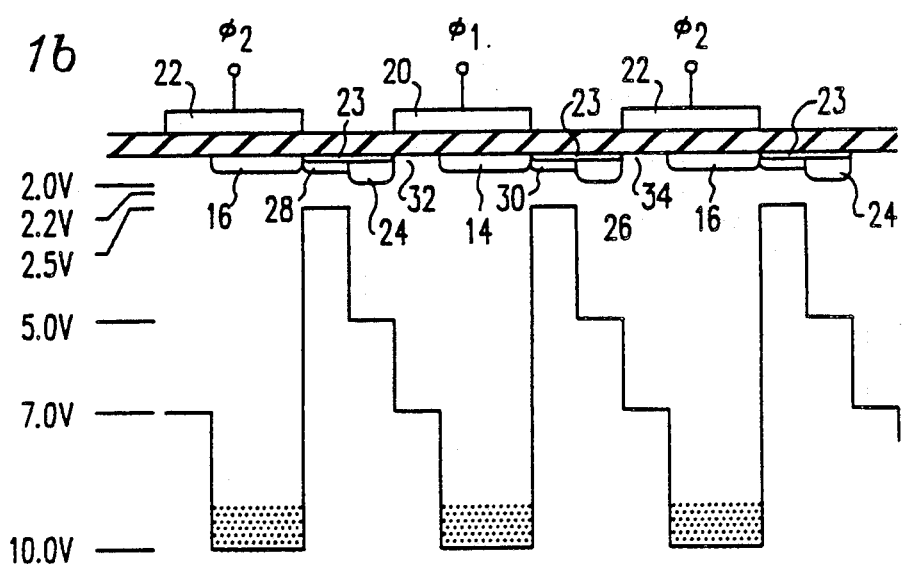
Figure 1C:
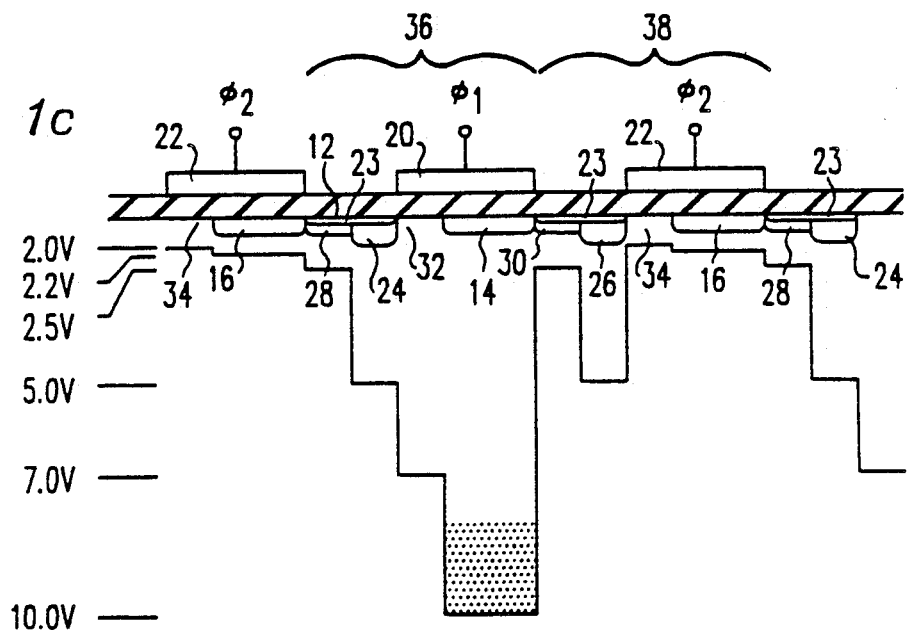

FIGS. 1a–1c are schematic sectional views taken along one column of CCD imager cells in an array thereof and showing successive stages in integration and transfer steps of operation. FIGS. 1a–1c combine a schematic sectional view of the device with a plot of the channel potentials that are obtained during various steps of operation.

Referring first to FIG. 1a, a semiconductor substrate is indicated generally at 10. Various implantations are made into the substrate in order to create the various wells and barriers of a CCD imager structure. The semiconductor substrate 10 is in this embodiment p type, although the conductivity types hereinafter described could be reversed.

The section shown in FIG. 1a is implanted with a buried channel implant (not shown), such that a buried channel extends from the semiconductor surface 12 to some distance therebelow. A plurality of clocked wells 14 and 16 are formed by selectively implanting arsenic or another n type semiconductor dopant species into substrate 10.

After the clocked well implant, a gate oxide layer 18 is grown on substrate 10. On top of the gate oxide layer 18, a conductive layer such as polysilicon is deposited, patterned and etched to form a plurality of gate electrodes 20 and 22. Gate electrodes 20 are connected to a phase one clock source, as shown, and gates 22 are connected to a phase two clock source.

After gate electrodes 20 and 22 have been formed, a self-aligned virtual barrier implant is made into the virtual regions extending between the clocked regions. Before or after this step, a further n-type implant is performed with a dopant such as phosphorus, as partially self-aligned by respective gates 20 and 22 to form a plurality of virtual well regions 24 and 26 each adjacent one edge of a respective gate electrode 20 or 22. The areas of the virtual barrier implants outside of virtual well regions 24 and 26 become virtual barrier regions 28 and 30. Then, gate electrodes 20 and 22 are used to self-align a shallow p+ implant that creates shallow virtual gate electrodes 23. Virtual gate electrodes 23 extend over regions 24, 28, 26 and 30.

A low-biased potential diagram of the structure is plotted immediately below the schematic sectional view in FIG. 1a. The low-bias voltage level applied to gates 20 and 22 in the illustrated embodiment is −10 volts. The sequence of implantations define a plurality of clocked barrier regions 32 and 34. The low-biased potential of these clocked barrier regions is in the illustrated embodiment approximately 2.0 volts, as shown. Adjacent each clocked barrier region 32 or 34 is a clocked well region 16 or 18 whose low-biased potential level is preferably about 2.2 volts. The virtual barrier regions 28 and 30 have potentials of 2.5 volts, as shown. Finally, the virtual well regions 24 and 26 have a potential of 5.0 volts.

Each adjacent group of a virtual barrier region 28, a virtual well region 24, clocked barrier region 32, and a clocked well region 14 constitutes a first phase region 36. Each adjacent grouping of a virtual barrier region 30, a virtual well region 26, a clocked barrier region 34 and a clocked well region 16 together constitutes a second phase region 38. Regions 36 and 38 alternate for a multiple number of times as disposed in any column of cells, as will be explained in more detail in conjunction with FIGS. 3a and 3b. Each first phase region 36 and an adjoining second phase region 38 together comprise a single CCD cell according to the invention.

FIG. 1a illustrates the accumulation of charge in first virtual wells 24 and second virtual wells 26 during an integration step of operation. During this integration phase, a negative gate bias voltage is impressed on both gates 20 and gates 22. Charge, indicated at 40 and 42 by stippling, will accumulate in each of the virtual wells 24 and 26.

Figure 2:
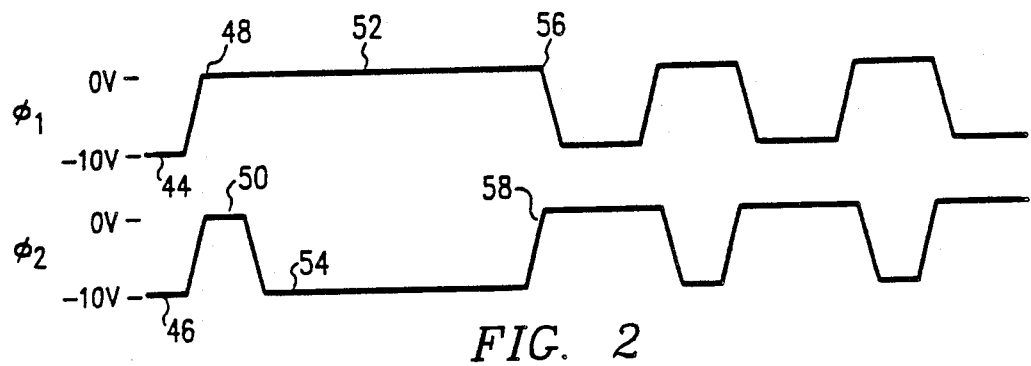
FIG. 2 is a timing diagram showing first and second clock pulse trains during charge integration and transfer steps of operation.

Referring briefly to FIG. 2, a timing diagram showing the clock train to be applied to phases $\phi_1$ and phase $\phi_2$ during various steps of operation of the device is shown. The integration step of operation is indicated at 44 and 46, where both clocks are held at low gate bias.

In FIG. 1b, a beginning substep in a transfer step of operation of the device is shown. In this substep, a high gate bias voltage is applied to both phase one electrodes 20 and phase two electrodes 22. The high bias voltage typically ranges from about 0 volts to about 2 volts. The application of the high gate bias voltage causes the charge accumulated in virtual wells 24 to be transferred over to clocked wells 14 and, at the same time, causes the charge accumulated in virtual wells 26 to be transferred over to the next adjacent clocked wells 16. From here on in the transfer step, the charge does not remain for any length of time in virtual wells 24 or 26, which are coupled through anitblooming barriers to overflow drains (see FIG. 3b). This has important implications in the antiblooming design, as will be more thoroughly explained in conjunction with FIGS. 3a and 3b.

In their high-biased states, the clocked barriers have a potential of approximately 7.0 volts in the preferred embodiment, and the clocked wells have a potential of approximately 10.0 volts. The high-biasing voltage applied to gates 20 and 22 preferably ranges from zero volts to about two volts. Since the potentials of both the clocked barriers 32 and 34 and the clocked wells 14 and 16 in their high-biased condition exceed the potentials of the adjacent virtual wells 24 and 26, all charge is transferred in a forward direction into the clocked wells 14 and 16. The 2.5 volt potential in the virtual barrier regions 28 and 30 assures that charge is not transferred in a reverse direction in this substep.

Referring again briefly to FIG. 2, this first substep in the transfer step of operation is indicated at 48 on the $\phi_1$ curve and at 50 on the $\phi_2$ curve, and shows that both phases of gate electrodes 20 and 22 are held at high gate bias during this substep.

Referring now to FIG. 1c, a next substep in the transfer step of operation is shown. During this substep, a selected one of the electrode gates 20 or 22 is held high while the other is brought low. In the illustrated embodiment, a voltage of −10 volts is applied to $\phi_2$ electrodes 22 while a voltage of zero volts is applied to $\phi_1$ electrodes 20. In its low-voltage condition, the potentials of clocked barriers 34 and clocked wells 16 are, respectively, 2.0 and 2.2 volts. This is less than the potential in the adjoining virtual barriers 28 at 2.5 volts. This potential is in turn less than the potential of adjoining virtual wells 24, at 5.0 volts. Thus, all charge in each clocked well 16 is transferred into a next adjacent clocked well 14. The charge integrated in both phase regions 36 and 38 in each cell is therefore transferred to reside in a single clocked well 14. One advantage of the invention is provided by the size of clocked well 14 or 16, which is fabricated to have twice the charge-containing capacity of virtual wells 24 or 26. In this way, a single clocked well 14 or 16 will be able to store all of the charge that can be integrated into a pair of virtual wells 24 and 26.

This ability to transfer the charge into a single clocked well of a pair of clocked wells operated by different phases is important for operation of the imager array in TV interlace mode. The interlace is achieved by changing the order of charge summing. When integrating a TV field "A", after both phase one and phase two are clocked high, as shown in FIG. 1b, the second phase $\phi_2$ is clocked low. This sums the charge in all clocked wells 16 under $\phi_2$ into the clocked well 14 under $\phi_1$. Then, for the "B" TV field, phase $\phi_1$ is made to go low first. This will sum the charge residing in $\phi_1$ clocked wells 14 into $\phi_2$ clocked wells 16. In this way, a pixel shift is achieved electronically.

A further advantage of the invention is conferred by this pixel shift in that it recovers a portion of the resolution that was lost by summing the charge in two separate pixels. For example, a conventional interlace TV format consists of 488 lines, the "A" lines alternating with the "B" lines. Dividing up the 488 lines into double pixels reduces the resolution to 244 lines. By the pixel shift above described, sufficient resolution is recovered to approximate 320 lines. To this is added the advantage of the very low dark current made possible by the use of virtual phase technology and the reduction in size of the memory which now only needs to hold 244 lines of information.

Turning now to FIG. 2, the substep of transferring the charge into a single clocked well is shown at 52 on the $\phi_1$ graph and at 54 on the $\phi_2$ graph. As just explained, these clock waveforms are reversed if it is desired to transfer the charge into the other clocked phase.

After the charge in each cell has been transferred into a single clocked well, the charges are transferred out in parallel through a series of clocked wells in a column direction. This begins at time 56 on the $\phi_1$ graph and at time 58 on the $\phi_2$ graph. Thereafter, the waveforms are such that $\phi_1$ and $\phi_2$ are never held at low bias at the same time. In the illustrated embodiment, this is accomplished by holding $\phi_2$ high longer than it is held low, while making the high and low intervals of the $\phi_1$ clock approximately the same.

Figure 3A:
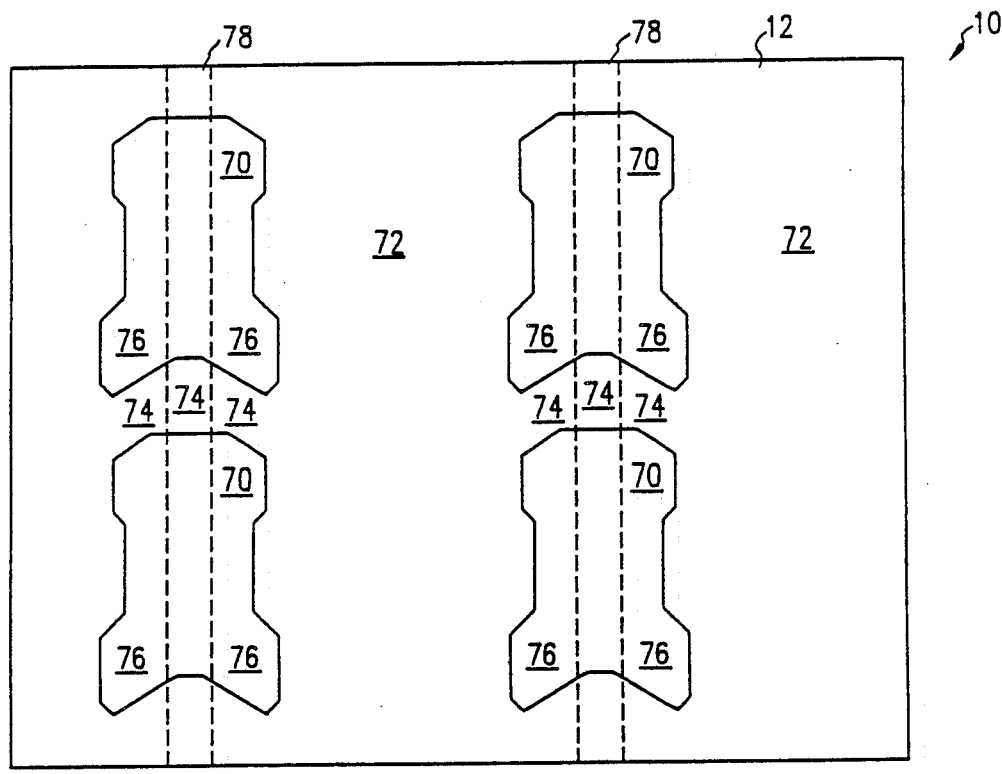
FIGS. 3a and 3b are enlarged schematic plan views of a semiconductor substrate showing stages in the fabrication of a CCD imager array according to the invention.
Figure 3B:
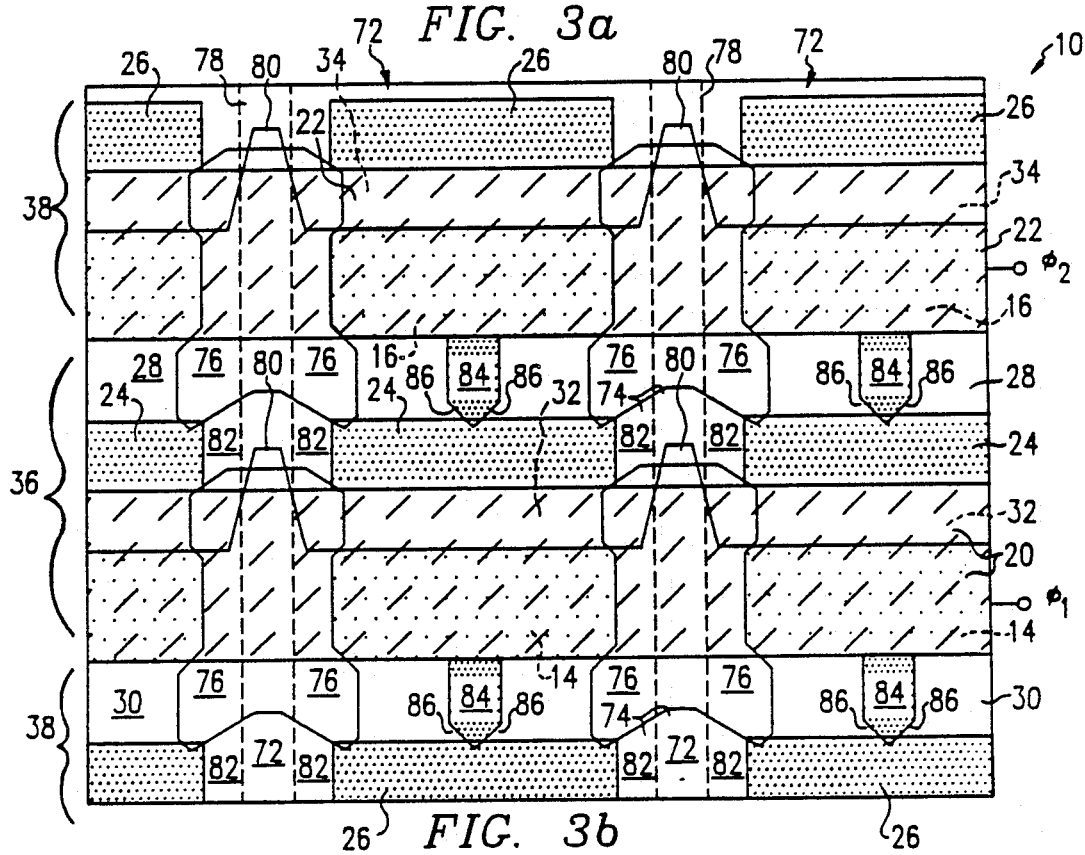

Referring now to FIGS. 3a and 3b, a highly magnified schematic plan view of a small portion of a CCD imager array according to the invention is shown, in particular illustrating beginning and final stages of fabrication. The elements identified in FIGS. 1a–1c are identified in FIGS. 3a and 3b with like numbers wherever possible.

Referring first to FIG. 3a, a reverse channel stop mask is deposited and patterned such that only a plurality of areas 70 remain covered. A buried channel implant is then performed into the remainder of the surface 12 of substrate 10. This defines a plurality of columnar channels 72 that are connected together by a plurality of horizontal areas 74. Horizontal interconnecting areas 74 are important for the construction of an antiblooming barrier, as will be described in relation to FIG. 3b.

Channel stop mask areas 70 each include a pair of protrusions 76 that extend both downwardly and outwardly from the general shape of a respective area 70. Protrusions 76 are formed as a barrier to the transmission of charge, such that the charge will be transmitted horizontally only through connecting areas 74.

Before or after this step, a plurality of n type antiblooming drains 78 are masked and implanted. Each antiblooming drain 78 is elongate in shape and is arranged in a columnar direction so as to be parallel to and between a respective pair of channels 72. Antiblooming drains 78 are only lightly n-type doped. In one embodiment, antiblooming drains 78 can be fabricated using phosphorus as a dopant at implantation energies around 120 keV and dopant concentrations of from 4 to $15 \times 10^{12}$ ions/cm$^2$. The relatively light doping of antiblooming drains 78 as compared to conventional structures is made to alleviate voltage breakdown. The drains 78 may in the alternative, be heavily doped, but in this case, the heavily doped n+ drains must be separated from the p+ areas to prevent low voltage breakdown. This alternative solution would sacrifice space and therefore resolution. Thus, the light doping of antiblooming drain 78 provides an advantage over the conventional structures in that it solves the voltage breakdown problem occurring between p+ and n+ structures by lightly doping antiblooming drains 78 for a higher breakdown of approximately +10 volts.

Drains 78 each intersect a plurality of horizontal areas 74, effectively dividing them in two. The combination of mask areas 70 and drains 78 effectively separate columnar channels 72 one from the other.

Referring now to FIG. 3b, the remaining steps in fabricating a CCD imager array according to the invention are illustrated. Following the implantation of the buried channels 72 and the antiblooming drains 78, a plurality of clocked wells 14 (for phase one) and 16 (for phase two) are masked and implanted to be n type. Clocked wells 14 and 16 are shown stippled as residing under respective gate electrodes 20 and 22. The clocked well implantation is also implanted into a plurality of tongues 80 that are each aligned with respective antiblooming drains 78. Tongues 80 are implanted in order to assist in the conductivity of the antiblooming drains 78. A gate oxide layer (not shown; see layer 18 in FIGS. 1a-1c) is then grown from semiconductor substrate 10.

Next, first and second phase gate electrodes 20 and 22 are deposited, patterned and etched to form a plurality of horizontal stripes running orthogonal to channels 72 and antiblooming drains 78. The extent of electrodes 20 and 22 is shown by dashed diagonal hatching. Gate electrodes 20 and 22 can be formed, for example, out of polysilicon or other conductive material. They are displaced in the columnar direction from protrusions 76, as are implanted clocked well regions 14 and 16. Each horizontal gate electrode 20 is disposed over a respective row of clocked wells 14 or 16. Electrodes 20 and 22 further define a plurality of clocked barriers 32 and 34 in the remaining substrate area therebeneath, as they act to self-align later implantation steps.

The gate electrodes 20 and 22 are used to self-align a virtual barrier implantation step that occurs in all areas of substrate 10 not covered by electrodes 20 and 22, including virtual barrier areas 28 and 30 and virtual well areas 24 and 26. Before or after this step, a plurality of virtual wells 24 and 26 may be implanted, as partially self-aligned by respective edges of polysilicon gate conductors 20 and 22. Virtual wells 24 and 26 are implanted so as to extend across channel 72 and intersect the corners of protrusions 76. This implantation step effectively defines the virtual barriers 28 and 30, and further defines a plurality of drain barriers 82 within horizontal areas 74. Barriers 82 are separated from the virtual barriers 28 or 30 by virtual wells 24 or 26, and protrusions 76. The function of drain barriers 82 will be described in detail below.

The gate electrodes 20 and 22 are further used to self-align a virtual gate implantation step that occurs in all areas of substrate 10 not covered by electrodes 20 and 22, including virtual barrier areas 28 and 30 and virtual well areas 24 and 26. This implantation step, which can be done for example with boron, results in a thin p+ type layer 23 (not shown; see FIGS. 1a-1c) at the surface 12 of semiconductor substrate 10. This layer forms a plurality of virtual gates over areas 28, 24, 30, 82 and 26. The dose of this implant however is not large enough to convert drain areas 78 into p type.

Since the p type virtual gate layers extending over areas 28, 24, 30, 82 and 26 are cut off from each other by the antiblooming drain 78 and are not connected to any other p+ channel stops, an alternate provision must be made to ground the virtual gate layers to the p type semiconductor substrate beneath the buried channels 72. In the illustrated embodiment, this is advantageously done by the deep implantation of a plurality of p+ type boat-shaped plugs 84.

A further advantage of the invention is provided by the particular location of plugs 84. Charge is integrated during the integration step of operation in virtual wells 24 and 26. Placement of plugs 84 in these areas would cause a diminution in the charge integration area and charge-storing capacity. Therefore, plugs 84 are advantageously placed within virtual barrier regions 28 and 30 so that no integration area will be lost.

Each plug 84 preferably has sloping lateral sides 86 that converge from the direction of a clocked well 14 or 16 to the direction of a virtual well 26 or 24. These sloped sides are set up to provide a potential difference within the respective virtual barrier 28 or 30. A certain potential exists between the edge of the buried channel or protrusion 76 and the straight edge of the plug 84. When sloped sides 86 are encountered as one proceeds from a clocked well 16 or 14 through a virtual barrier 28 or 30 toward a virtual well 24 or 26, this potential becomes higher. This gradient in potential provides an additional lateral field for charge flowing across the virtual barrier from clocked well 14 or 16 to virtual well 24 or 26. This is particularly advantageous when the virtual barrier 28 or 30 is very long. In this case (not shown), the plug is put in only a first part of the virtual barrier. The plug will then generate a small potential difference between the virtual barrier portion with the plug and the portion without the plug, thereby providing an additional lateral field to accelerate the charge. Charge transfer efficiency is thereby increased.

The operation of the clock pulses according to the invention, together with the unique construction of the cells of the invention, provide an additional advantage in that the antiblooming drains 78 are available to drain off excess charge during the integration step of operation, but are not available to drain off any charge during the transfer step of operation. This effect obtains as follows.

During the integration step of operation, charge is accumulated in each virtual well 24 or 26. Each of these virtual wells 24 or 26 has a limited capacity. As further charge is integrated beyond the capacity of these wells, the charge flows through the drain barrier regions 82 into the antiblooming drain 78. This is because drain barrier regions 82 have a higher potential (2.5 volts) than the low-biased potentials of the clocked wells 16 or 14 (2.2 volts) or the clocked barriers 22 or 20 (2.0 volts). Therefore, the charge will not be transferred over to other virtual wells, and an effective method of antiblooming control is established.

However, during the transfer step of the operation, the charge resides only within clocked wells 14 or 16, and only passes through virtual barriers 28 and 30 in transfer between these clocked wells. During the step of transfer, the charge, for example, will proceed from a clocked well 14 through a virtual barrier 28 and into a virtual well 24, which will accumulate charge as it has a higher potential than either the virtual barrier 28 or the drain barrier 82. Because the virtual barriers 28 or 30 are effectively separated from the drain barrier 82 by a respective protrusion 76, there will be no leakage into antiblooming drain 78. In this way, antiblooming drain 78 is effectively isolated from the charge during the transfer step of operation. Antiblooming drain 78 can therefore be combined in a novel manner with virtual phase operation of the device to yield a highly advantageous structure that has low dark current and good antiblooming control.

Figure 4:
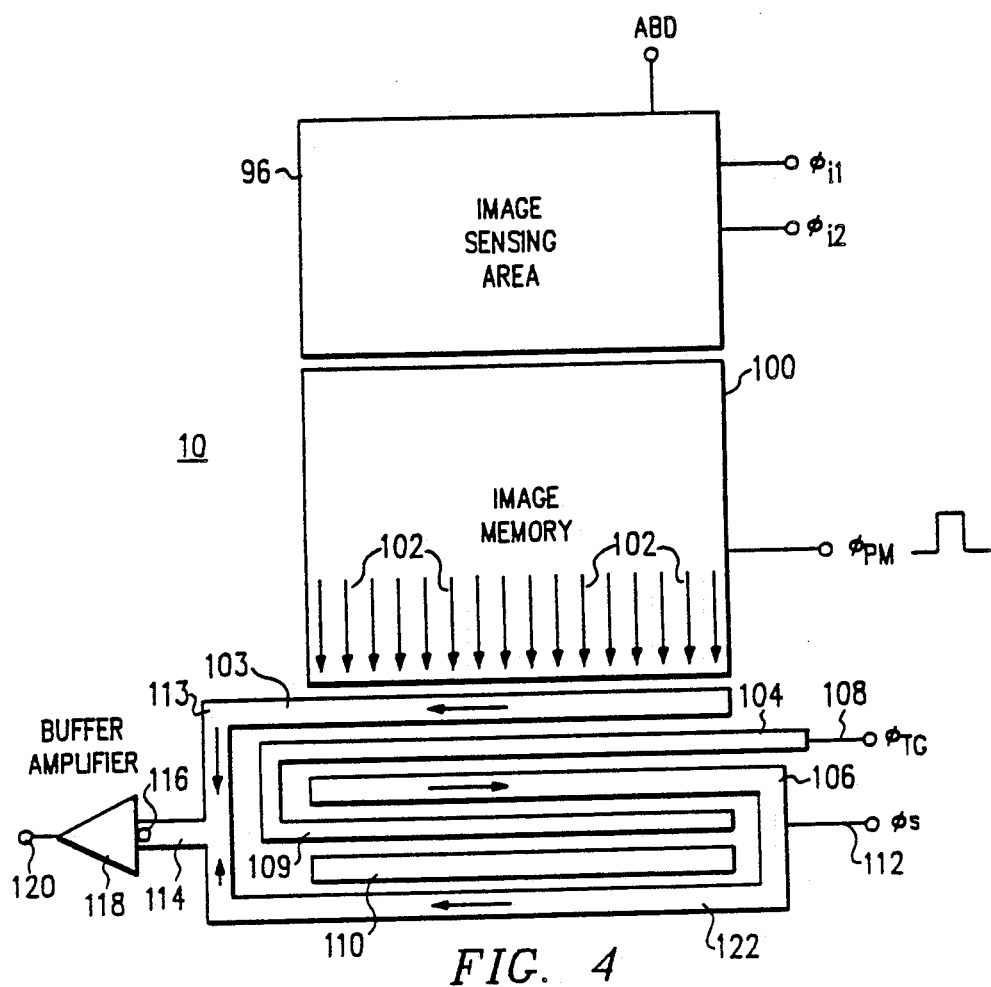
FIG. 4 is a schematic plan view of a mirror-image CCD output register adapted for use with the invention.

Turning now to FIG. 4, an on-chip mirror-image readout register is shown that may be advantageously used with the invention. A CCD imager array sensing area 96 is formed at a face of semiconductor substrate 10. Sensing area 96 preferably incorporates those aspects of the invention as described in conjunction with FIGS. 1a-3b. Area 96 is coupled to a first pulse source $\phi_{i1}$ and a second pluse source $\phi_{i2}$ for biasing the sensor cells therein (not shown) for charge integration and transfer. Sensing area 96 is formed in semiconductor substrate or layer 10 electrically adjacent one side of an image memory 100. Image memory 100 may, for example, be formed to store all of the information for a particular TV field "A" or "B". A clock source $\phi_{pm}$ controls the shifting of memory information from one row of CCD cells to another in a plurality of parallel columns 102. The readout register may be formed using conventional CCD fabrication processes.

A first, forward transfer register 103 is disposed electrically adjacent the last row of cells such that the $\phi_{pm}$ transfer gate pulse will actuate the transfer of a row of charges into a like number of CCD cells (not shown) disposed in series within the forward register 103. An elongate transfer gate 104 is disposed on the other side of first register 103. A second serial register 106 is disposed on the other side of transfer gate 104. A pulse delivered to transfer gate 104 from transfer gate pulse source 108 is operable to transfer a row of charges from a plurality of serially coupled CCD cells (not shown) in first register 103 through transfer gate 104 to a like plurality of serially coupled CCD cells in second serial register 106.

A leg 108 of transfer gate 104 is disposed on the other side of second register 106. Transfer gate leg 108 is disposed between second register 106 and a drain 110. The actuation of transfer gate leg 108 causes the transfer of charges within respective cells (not shown) of second register 106 through leg 108 into the drain 110.

A serial register clock source 112 supplies a transfer pulse $\phi_s$ to serially transfer charges from one CCD well to the next inside serial registers 103 and 106. Serial register 103 extends through a leg 113 thereof to serially connect to a common register portion 114, and thence through a detection node 116 to a buffer amplifier 118. Amplifier 118 outputs an inverted output at 120. Second register 106 is operable to serially transfer its charges through a leg 122 thereof until its junction with common register portion 114. Charges appearing from second register 106 are output through sense node 116 and buffer amplifier 118 in a manner identical to the output of charges from first register 103.

In operation, a true-image output mode or a mirror-image output mode is selected. If the true-image mode is selected, a row or line of data is transferred from the last row of cells (not shown) in image memory 100 to respective CCD cells in first serial register 103. Pulses $\phi_s$ are applied from serial register pulse source 112 to first register 103 to serially output this line of data through sense node 116 and amplifier 118 to output 120. Successive lines of data output in this fashion will reproduce a true image.

If a mirror-image output mode is selected, each line of data is transferred from the last row of CCD memory cells within image memory 100 into first register 103, as before. These data are not however transferred out serially, but are instead actuated by transfer gate 104 to be transferred into the beginning section of second register 106. The data are then serially output along second register 106, leg 122 thereof and common section 114 through sense node 116 and amplifier 118 to the output 120. Successive lines of data output in this fashion will produce a mirror image of what was stored inside image memory 100.

To clear the register entirely, transfer gate pulse source 108 is repeatedly actuated such that all data contained in the output register are transferred from register 103 to register 106, and from there through transfer gate leg 108 to drain 110.

In summary, a novel two-phase CCD imager cell has been provided for TV interlace operation. The imager cell combines the advantages of virtual-phase CCD imager technology, such as low dark current, with an antiblooming drain structure.

While preferred embodiments and their advantages have been set out in the above detailed description, the invention is not limited thereto, but only by the spirit and scope of the appended claims.

What is claimed is:

1. A charge-coupled device imager cell formed in a semiconductor substrate comprising:
   adjacent first and second phase regions, each said phase region including a clocked region and a virtual region, said clocked region defined by a first series of dopants in said substrate, said virtual region defined by a second series of dopants in said substrate and accumulating charge therein in response to incident light;

a gate electrode insulatively disposed over each clocked region;

antiblooming region in said substrate adjacent said clocked and virtual region and bordering said first and second phase regions;

a controller for transferring the charge from the virtual region to the clocked region of each respective phase region and subsequently selectively transferring the charge in one said clocked region of one of said phase regions to another said selected region in an adjoining one of said phase regions by applying a predetermined voltage to a selected one of said gate electrodes; wherein said predetermined voltage applied to said selected one of said gate electrodes to transfer the charge from one said clocked region to another said clocked region disables said antiblooming region during transfer of the charge.

2. The imager cell of claim 1 wherein said predetermined voltage is selected such that a potential formed thereby in a respective clocked region exceeds the potential of the virtual region within the same phase region and the charge being transferred from one said clocked region to another said clocked region flows through but does not accumulate in an intervening one of said virtual regions.

3. The imager cell of claim 1 wherein each said clocked region has a charge capacity of approximately twice the capacity of the virtual region in the same phase region.

4. A charge-coupled device image sensor cell formed in a face of a semiconductor layer, comprising:

a first phase region formed in said face, a second phase region formed in said face and adjoining said first phase region, each phase region further comprising:

a virtual barrier region having a first dopant concentration formed in said face at one side of said phase region and adjoining a preceding phase region;

a virtual well region having a second dopant concentration formed in said face adjacent said virtual barrier region;

a clocked barrier region having a third dopant concentration formed in said face adjacent said virtual well region;

a clocked well region having a fourth dopant concentration formed in said face adjacent said clocked barrier region and adjoining a next phase region; and a clock gate insulatively disposed over said clocked barrier region and said clocked well region;

each barrier and well region having respective first potentials, the potentials of said virtual barrier and virtual well of each phase region exceeding the first potentials of said clocked barrier region and said clocked well region thereof;

a controller coupled to said clock gates for applying a predetermined voltage thereto, said voltage operable to create respective second potentials in said clocked barrier region and said clocked well region that exceed the potentials of said virtual barrier region and said virtual well region in the same phase region, said controller operable to switch between an integration step of operation for integrating charge in said virtual wells and a charge transfer step of operation for transferring charge among said clocked wells;

said controller operable during said charge transfer step to apply said voltage to said clock gates to transfer charge from each virtual well into a respective clocked well, said controller operable at the beginning of said transfer step to apply said voltage to a selected one of either of said clock gates to transfer charge to a clocked well associated with the one of said clock gates, such that the charge integrated in said cell is stored in a clocked well of a selected phase region thereof.

5. The cell of claim 4, and further comprising:

a drain barrier region formed at said face laterally adjacent each said virtual well region and spaced from a respective virtual barrier region; and a drain region formed laterally adjacent said drain barrier region and spaced thereby from said virtual well region, said drain region receiving excess charge from said virtual well region through said drain barrier region during the integration step of operation.

6. The cell of claim 4, wherein said semiconductor substrate is of a first conductivity type, a buried channel formed in said semiconductor substrate of a second conductivity type, said first and second phase regions formed as portions of said buried channel;

a virtual gate of said first conductivity type for each phase region formed at said face above said buried channel and to be coextensive in area with said virtual barrier region and said virtual well region; and a connector region of said first conductivity type formed from said virtual gate through said buried channel to connect to said substrate therebeneath in order to ground said virtual gate to the semiconductor substrate.

7. The cell of claim 6, wherein said connector region is formed laterally within said virtual barrier region.

8. The cell of claim 7, wherein each said virtual barrier region is laterally bounded on a first side by a clocked well region and on a second side opposed to first side by a virtual well region, said virtual barrier region having third and fourth lateral sides connecting said first and second sides, each of said third and fourth sides adjoining a respective drain barrier region, a plurality of antiblooming drains of a second conductivity type formed in said semiconductor substrate, each drain barrier region disposed between one of said third or fourth sides and one of said antiblooming drains.

9. The cell of claim 8, wherein said connector region is disposed approximately midway between said drain barrier regions to reduce the potential between said connector region and each said drain region, such that the charge transfer efficiency through said virtual barrier region from said clocked well on said second side to said virtual well region on said first side is improved.

10. The cell of claim 9, wherein said connector region is laterally tapered from a relatively thick width adjoining said clocked well region to a relatively thin width adjoining said virtual well region.

11. The cell of claim 4, wherein each virtual well region has approximately one half the charge capacity of a respective clocked well region.

12. Apparatus for selectively outputting a mirror image of an image stored in a memory array formed at a face of a semiconductor substrate, comprising:

a memory array of storage elements arranged in rows and columns, each storage element operable to store an image signal;

means for transferring image signals from a row of elements;

a first charge-coupled device register disposed adjacent said edge for receiving said image signals in parallel;

a transfer gate disposed adjacent said charge-coupled device register for receiving said image signals from said means for transferring;

a second charge-coupled device register disposed adjacent said transfer gate and opposite said first charge-coupled device register, said transfer gate operable to transfer said image signals in parallel from said first register to said second register;

one of said first and second charge-coupled device registers operable to serially output said image signals in a first direction when a true image is desired, the other of said first and second charge-coupled device registers operable to serially output said image signals in a second direction opposite the first direction when a mirror image is desired.

13. A method for integrating and transferring a plurality of signals resulting from the receipt by first and second phase regions of a charge-coupled device imager cell formed in the face of a semiconductor substrate, comprising the steps of:

integrating charge in first and second phase regions responsive to incident electromagnetic radiation;

receiving charge in a first clocked well from the first phase region responsive to creating a predetermined potential in the first clocked well;

receiving charge in a second clocked well from the second phase region in response to the creation of a predetermined potential in the second clocked well, the second phase region being adjacent said first phase region;

transferring the charge from a selected one of the first and second clocked wells to the other of the clocked wells by reducing the potential in the one of the clocked wells and maintaining the potential in the other of the clocked wells; and transferring the charge stored in the other of the clocked wells to an output as a single signal.

14. The method of claim 13, and further including the steps of:

integrating the charge in a first virtual well adjacent the first clocked well and in a second virtual well adjacent the second clocked well; and increasing the potential in the clocked wells to the predetermined potential to respectively transfer charge to the first and second clocked wells.

15. A method for integrating and transferring a plurality of signals resulting from light incident upon a plurality of charge-coupled device imager cells formed in a face of a semiconductor substrate, each cell comprising in successive relationship a first virtual barrier, a first virtual well, a first clocked barrier, a first clocked well, a second virtual barrier, a second virtual well, a second clocked barrier and a second clocked well, the second clocked well of each cell adjacent a first virtual barrier of a next adjacent cell, the method comprising the steps of:

integrating charge in each of a plurality of virtual wells disposed in each cell in a charge-coupled device imager array, the cells disposed in rows and columns orthogonal to the rows;

thereafter increasing the potential of the clocked barriers and the clocked wells such that charge accumulated in each virtual well is transferred to a respective next adjacent clocked well;

in each cell, decreasing the potential of a selected one of the first clocked barrier and the second clocked barrier and decreasing the potential of a selected one of the first clocked well and the second clocked well while keeping the potentials of the unselected clocked well and clocked barrier at an increased level to transfer the charge stored in the selected one of the clocked wells to the other of the clocked wells; and for each cell, subsequently reading out the charge stored in the unselected clocked well as a single signal from the cell.

16. The method of claim 15, and further including the step of:

transferring excess charge that overflows a virtual well during said step of integrating charge through a drain barrier to an antiblooming drain.

17. The method of claim 15, wherein said single signal is a portion of a selected phase of an interlaced TV readout, the method including the further steps of:

performing said steps of integrating, increasing the potential, decreasing the potential and reading out successively for each odd row of cells of the imager array, the selected clocked well and clocked barrier of each cell in each odd row being the first clocked well and first clocked barrier for said step of decreasing the potential; and subsequently performing said steps of integrating, increasing the potential, decreasing the potential and reading out successively for each even row of cells of the imager array, the selected clocked well and clocked barrier for each cell in each even row being the second clocked well and the second clocked barrier for said step of decreasing the potential.

18. A method for selectively outputting a mirror image stored in a memory array formed at a face of a semiconductor substrate, comprising the steps of:

storing a plurality of image signals in a memory array of storage elements arranged in rows and columns;

transferring the image signals from a selected row of the storage elements in parallel to a first charge-coupled device register disposed adjacent the edge of the array, the first charge-coupled device register operable to serially output the image signals in a selected one of two directions, a first direction producing a true image and a second direction producing a mirror image;

if a selected one of the images is desired, serially outputting the image signals from the first charge-coupled device register;

performing the following steps if the other image is desired;

transferring in parallel the image signals through a transfer gate to a second charge-coupled device register; and serially outputting the image signals from the second charge-coupled device register in the other direction opposed to the selected one direction to obtain the other image.

* * * * *